(12) United States Patent
Komiyama et al.

(10) Patent No.: US 8,821,769 B2
(45) Date of Patent: Sep. 2, 2014

(54) SILVER ALLOY TARGET FOR FORMING REFLECTION ELECTRODE FILM FOR ORGANIC EL ELEMENT, AND METHOD FOR MANUFACTURING THE SILVER ALLOY TARGET

(75) Inventors: Shozo Komiyama, Sanda (JP); Ikuo Ito, Sanda (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 13/500,224

(22) PCT Filed: Oct. 5, 2010

(86) PCT No.: PCT/JP2010/067817
§ 371 (c)(1),
(2), (4) Date: Apr. 4, 2012

(87) PCT Pub. No.: WO2011/043486
PCT Pub. Date: Apr. 14, 2011

(65) Prior Publication Data
US 2012/0193589 A1  Aug. 2, 2012

(30) Foreign Application Priority Data

Oct. 6, 2009 (JP) ................................ 2009-232634
Sep. 17, 2010 (JP) ................................ 2010-210149

(51) Int. Cl.
*F21V 9/00* (2006.01)
*G02B 5/02* (2006.01)
*G02C 7/10* (2006.01)
*G02F 1/361* (2006.01)
*G03B 11/00* (2006.01)
*B21B 27/06* (2006.01)

(52) U.S. Cl.
USPC ........ 252/582; 72/200; 148/430; 204/192.15; 204/298.12; 204/298.13; 428/64.1; 428/64.4

(58) Field of Classification Search
USPC .......... 72/200; 148/430; 204/192.15, 298.12, 204/298.13; 252/582; 428/64.1, 64.4
See application file for complete search history.

(56) References Cited

U.S. PATENT DOCUMENTS 5,456,815 A   10/1995 Fukuyo et al.
7,763,126 B2   7/2010 Takagi et al.
(Continued)

FOREIGN PATENT DOCUMENTS

CN   1823179 A   3/2012
JP   6299342 A   10/1994
(Continued)

OTHER PUBLICATIONS

International Search Report of PCT/JP2010/067817 dated May 8, 2012.
(Continued)

*Primary Examiner* — Bijan Ahvazi
(74) *Attorney, Agent, or Firm* — Edwards Wildman Palmer LLP; Jeffrey D. Hsi

(57) ABSTRACT

Disclosed is a silver alloy target for forming a reflective electrode film for an organic EL element, which has a component composition containing 0.1% to 1.5% by mass of In and the remainder composed of Ag and unavoidable impurities. The average grain diameter of the crystal grain of the alloy is 150 to 400 μm, and the dispersion of the grain diameter of the crystal grain is 20% of the average grain diameter or less.

4 Claims, 3 Drawing Sheets

(56) References Cited

U.S. PATENT DOCUMENTS

2006/0169577 A1    8/2006    Takagi et al.
2010/0264018 A1    10/2010    Takagi et al.

FOREIGN PATENT DOCUMENTS

| | | |
|---|---|---|
| JP | 2004084065 A | 3/2004 |
| JP | 2005036291 A | 2/2005 |
| WO | WO 03/100112 A1 * | 12/2003 |
| WO | WO-03/100112 A1 | 12/2003 |

OTHER PUBLICATIONS

CN Office Action dated Aug. 10, 2012 for CN Patent Application for Invention No. 201080020030.9.

Notice of Refusal for Taiwanese Patent Appln. No. 099134036.

* cited by examiner

SILVER ALLOY TARGET FOR FORMING REFLECTION ELECTRODE FILM FOR ORGANIC EL ELEMENT, AND METHOD FOR MANUFACTURING THE SILVER ALLOY TARGET

CROSS REFERENCE TO RELATED APPLICATIONS

This application is the national phase under 35 U.S.C. §371 of PCT International Application No. PCT/JP2010/067817, filed Oct. 5, 2010, which claims the benefit of Japanese Patent Application No. 2009-232634, filed Oct. 6, 2009, and Japanese Patent Application No. 2010-210149, filed Sept. 17, 2010, the entire contents of the aforementioned applications are hereby incorporated herein by reference.

BACKGROUND OF THE INVENTION

1. Field of the Invention

The present invention relates to a silver alloy target for forming a reflective electrode film for an organic EL element, and a method for manufacturing the silver alloy target. More specifically, the present invention relates to a large-sized silver alloy target for forming a reflective electrode film for a organic EL element.

2. Description of the Related Art

Conventionally, as display devices, the cathode-ray tube (CRT), the liquid crystal display (LCD), the plasma display (PDP), the light emitting diode (LED), the EL display, or the like have been known. Such display devices are widely used as the back panel of the computer display and the liquid crystal display.

Among these, organic EL elements are recently receiving considerable attention and are light-emitting elements using the principle in which a voltage is applied between a positive electrode and a negative electrode formed on either side of an organic EL light-emitting layer, positive holes and electrons are injected into an organic EL film from the positive electrode and the negative electrode, respectively, to thereby emit light from the organic EL film when positive holes and electrons are combined in the organic EL light-emitting layer.

An organic EL element driving method includes the passive matrix type and the active matrix type. The active matrix type can provide high-speed switching for each of pixels by providing one or more thin-film transistors, and thus, is advantageous for high contrast ratio and fineness and can exhibit the characteristics of organic EL elements.

The light extraction method includes the bottom emission type that extracts light from a transparent substrate side and the top emission type that extracts light at the opposite side of the substrate. The top emission type which has a high aperture ratio is advantageous for obtaining a higher luminance and may become a future trend.

FIG. 1 shows an example of the configuration of a layer in a top emission structure where the reflective electrode is a positive electrode. Here, in order to efficiently reflect light emitted from an organic EL layer, it is preferable that a reflective electrode film (described as a "reflective positive electrode film" in FIG. 1) provide high reflectivity and high corrosion resistance. It is also preferable that the reflective electrode film has a low resistance as an electrode. Such materials known include Ag alloy and Al alloy. In order to obtain an organic EL element having a higher luminance, Ag alloy is excellent in high visible light reflection.

Here, a sputtering method is employed for forming a reflective electrode film for an organic EL element, and a silver alloy target is employed (Patent Document 1).

With increasing the size of a glass substrate during the production of an organic EL element, a large-sized silver alloy target used for forming a reflective electrode film has also come to be employed. Here, when a large-sized target is subjected to sputtering by applying high electric power thereto, a phenomenon called "splashing" generated by abnormal discharge in the target occurs. Consequently, molten micro particles may be attached to the substrate to thereby cause a short circuit between wirings and electrodes, resulting in a decrease in the yield of the organic EL elements. In a reflective electrode layer of the top emission type organic EL element, a higher flatness is required in order to attain an undercoat layer for an organic light-emitting layer, and the occurrence of splashing needs to be suppressed.

PRIOR ART DOCUMENTS

Patent Documents

[Patent Document 1] WO 2002/077317

SUMMARY OF THE INVENTION

Problems to be Solved by the Invention

It is an object of the present invention to provide a silver alloy target for forming a reflective electrode film for an organic EL element, which is capable of suppressing the occurrence of splashing even when a large electric power is applied to the target, being associated with the increasing size of the target.

Means to Solve the Problems

The present inventors have found that splashing may be suppressed even when a large electric power is applied to a silver alloy target for forming a reflective electrode film for an organic EL element by setting the average grain diameter of the crystal grain thereof to be in the range of 150-400 μm by the specific manufacturing method. In particular, the present invention relates to a silver alloy target for forming a reflective electrode film for an organic EL element and a method for manufacturing the same, which adopt the following configuration in order to overcome the aforementioned problems.

(1) A silver alloy target for forming a reflective electrode film for an organic EL element, the silver alloy target having a component composition containing 0.1% to 1.5% by mass of In and the remainder composed of Ag and unavoidable impurities, wherein the average grain diameter of the crystal grain of the alloy is 150-400 μm and the dispersion of the grain diameter of the crystal grain is 20% of the average grain diameter or less.

(2) The silver alloy target for forming a reflective electrode film for an organic EL element according to (1), wherein the surface of the target has an area equal to or greater than 0.25 $m^2$.

(3) A method for manufacturing a silver alloy target for forming a reflective electrode film for an organic EL element, the method comprising in sequence: repeating hot upset forging 6 to 20 times for an ingot formed by melting and casting having a component composition containing 0.1% to 1.5% by mass of In and the remainder composed of Ag and unavoidable impurities; cold-rolling the forged ingot; subjecting the cold-rolled board to a heat treatment; and machining the heat-treated board.

(4) The method for manufacturing a silver alloy target for forming a reflective electrode film for an organic EL element according to (3), wherein the temperature of the hot upset forging is from 750 to 850° C.

(5) An organic EL element including a reflective electrode film formed by the silver alloy target for forming a reflective electrode film for an organic EL element according to (1) or (2).

Effects of the Invention

According to the present inventions (1) and (2), a target which is capable of suppressing abnormal discharge and the occurrence of splashing even when a large electric power is applied to the target during sputtering is obtained. By sputtering the target, a reflective electrode film for an organic EL, which exhibits high reflectivity and excellent durability, may be obtained.

According to the present inventions (3) and (4), a silver alloy target for forming a reflective electrode film for an organic EL element, which is capable of suppressing the occurrence of splashing even when a large electric power is applied to the target during sputtering, may be manufactured.

DESCRIPTION OF THE EMBODIMENTS

Figure 1:
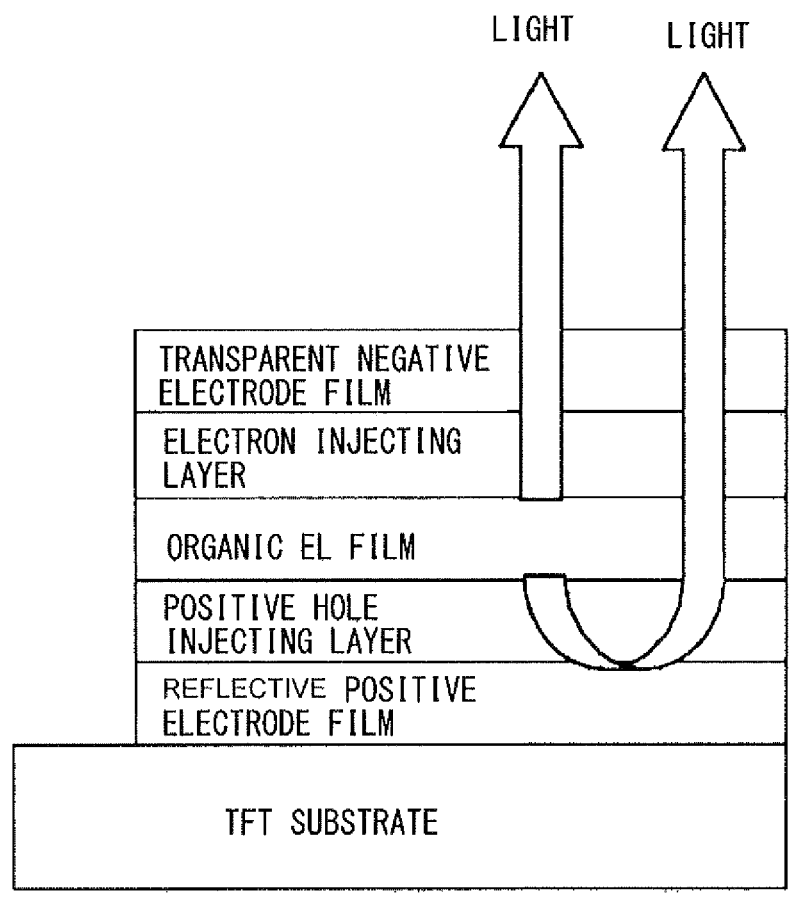
FIG. 1 shows an example of the configuration of a layer in a top emission structure where the reflective electrode is a positive electrode.

Hereinafter, a specific description will be given based on the embodiments of the present invention. In this specification, a percentage represents percent by mass if not otherwise specified or unless a percentage represents a specific numerical value.

[A Silver Alloy Target for Forming a Reflective Electrode Film for an Organic EL Element]

The large-sized silver alloy target for forming a reflective electrode film for an organic EL element of the present invention (hereinafter referred tows "the target of the present invention") is an alloy target having a component composition containing 0.1% to 1.5% by mass of In and the remainder composed of Ag and unavoidable impurities, wherein the average grain diameter of the crystal grain of the target of the present invention (hereinafter referred to as "the crystal grain of the silver-indium alloy") is 150-400 μm and the dispersion of the grain diameter of the crystal grain of the silver-indium alloy is 20% of the average grain diameter or less.

In the target of the present invention, the surface of the target (the surface of the target to be subjected to sputtering) has an area of 0.25 m$^2$ or greater. In the case of a rectangular target, at least one side thereof has a length of 500 mm or greater. From the viewpoint of handling of the target, the upper limit of the length is preferably 2500 mm. On the other hand, from the viewpoint of the upper limit of the general size which is rollable by a rolling machine used in a cold-rolling step, the upper limit of the width is preferably 1700 mm. From the viewpoint of replacement frequency of a target, the thickness of a target is preferably 6 mm or greater. From the viewpoint of discharging stability of magnetron sputtering, the thickness of a target is preferably 20 mm or less.

Ag imparts high reflectivity and low resistance to a reflective electrode film for an organic EL element formed by sputtering.

In improves the hardness of a target so as to suppress warpage during machining. In particular, the warpage of a large-sized target having a length of 1 m or greater may be suppressed during machining. Moreover, In has the effect of improving the corrosion resistance and heat resistance of a reflective electrode film for an organic EL element formed by sputtering. This is because In has the effect of finely dividing the crystal grain contained in a reflective electrode film and reducing the surface roughness of the film. Additionally, In has the effect of increasing the strength of the crystal grain by forming solid solution in Ag and suppressing the recrystallization of the crystal grain so as to suppress a reduction in the reflectivity of the reflective electrode film formed by sputtering. Improvements in the corrosion resistance and heat resistance of the reflective electrode film contribute a higher luminance and a longer life of an organic EL element. Furthermore, if the Indium content is 21% by mass or less, In and Ag do not form a compound phase, and thus, abnormal discharge caused by the compound crystal grain having a different specific resistance does not occur during sputtering.

When the Indium content is less than 0.1% by mass, the effect obtained by the addition of In may not be expected. On the other hand, when the Indium content exceeds 1.5% by mass, the properties of In having a low reflectivity are developed, resulting in a reduction in the reflectivity of the reflective electrode film formed by sputtering, which is not desirable. Since the composition of the reflective electrode film formed by sputtering depends on the composition of the target, the Indium content in the silver alloy target is 0.1% to 1.5% by mass and preferably 0.2% to 1.0% by mass. Here, In is quantitatively-analyzed by Inductively Coupled Plasma Spectrometry (ICP Spectrometry).

The average grain diameter of the crystal grain of the silver-indium alloy contained in the silver alloy target is 150 to 400 μm and preferably 200 to 350 μm. If the average grain diameter of the crystal grain of the silver-indium alloy is smaller than 150 μm, the dispersion of the crystal grain diameter increases. Consequently, abnormal discharge readily occurs during high-power sputtering, resulting in the occurrence of splashing. On the other hand, if the average grain diameter of the crystal grain of the silver-indium alloy is greater than 400 μm, the unevenness of the sputtering surface increases due to the differences between sputtering rates caused by the differences between crystal orientations of the crystal grains in association with the abrasion of the target during sputtering. Consequently, abnormal discharge readily occurs during high-power sputtering, resulting in the occurrence of splashing. Here, the average grain diameter of the crystal grain of the silver-indium alloy is measured as follows.

The rectangular parallelepiped samples having a length of about 10 mm on each side are uniformly obtained from sixteen points of the sputtering surface of the target. More specifically, the target is segmented into sixteen sections (four by four), and the sample is obtained from the central portion of each of the sixteen sections. The present invention has been established bearing in mind a large-sized target which is used for the formation of an organic EL element and has a sputtering surface of 500×500 (mm) or greater. Thus, a description has been given of a method for obtaining samples from the rectangular target generally used as a large-sized target. However, it is of course that the present invention also provides the effect of suppressing the occurrence of splashing for the rounded target. In this case, the target is segmented into sixteen sections in the same manner as the method for obtaining samples in the large-sized rectangular target, and samples are uniformly obtained from sixteen points of the sputtering surface of the target.

The sputtering surface of each sample piece is polished. The sputtering surface of each sample piece is polished by a waterproofing paper of #180 to #4000, and then, polished by buffing using abrasive grains of 1 μm to 3 μm.

Then, the polished sample piece is subjected to etching in a manner such that the grain boundaries can be seen by an optical microscope. Here, a mixed solution of hydrogen peroxide and aqueous ammonia is used as an etching solution. Each sample piece is immersed into the etching solution for 1-2 seconds at room temperature so that the grain boundaries will emerge. Next, a photograph of each sample is taken by an optical microscope at a magnification of 30×.

Four line segments having a length of 60 mm are drawn on each photograph in longitudinal and transverse directions at the interval of 20 mm in a cross-shaped manner, and the number of crystal grains cut by each line is counted. The crystal grain at the end of the line segment is counted as 0.5. The average intercept length: L (μm) is calculated using Formula: $L=60000/(M \cdot N)$ (here, M is the actual magnification and N is the average value of the number of cut crystal grains).

The average grain diameter of samples: d (μm) is calculated using Formula: $d=(3/2) \cdot L$, based on the calculated average intercept length: L (μm).

The average value of the average grain diameters of samples obtained from sixteen points is the average grain diameter of the crystal grain of the silver-indium alloy of the target. The average grain diameter of the crystal grain of the silver-indium alloy of the target of the present invention is in the range of 150-400 μm.

If the dispersion of the grain diameter of the crystal grain of the silver-indium alloy is 20% of the average grain diameter of the crystal grain of the silver-indium alloy or less, the occurrence of splashing during sputtering may be surely suppressed. Here, the maximum absolute value of the deviation between the average grain diameter of one point and the average grain diameter of sixteen points (|[(average grain diameter of one point)−(average grain diameter of sixteen points)]|) is specified, and the dispersion of the grain diameter is calculated using the specified average grain diameter (specified average grain diameter) as follows:

|[(specified average grain diameter)−(average grain diameter of sixteen points)]|/(average grain diameter of sixteen points)×100(%)

The silver alloy target for forming a reflective electrode film for an organic EL element of the present invention is capable of suppressing abnormal discharge and the occurrence of splashing even when a large electric power is applied to the target during sputtering. A reflective electrode film for an organic EL exhibiting high reflectivity and excellent durability may be obtained by sputtering the target. The present invention is particularly effective when the target is a large-sized target having a width of 500 mm, a length of 500 mm and a thickness of 6 mm or greater.

[Manufacturing Method]

For manufacturing the silver alloy target for forming a reflective electrode film for an organic EL element of the present invention, Ag with the purity of 99.99% by mass or greater and In with the purity of 99.9% by mass or greater are used as raw materials.

First, Ag is melted under a high vacuum or an inert gas atmosphere, and then, a predetermined Indium content is added to the obtained molten metal. Then, the resulting mixture is melted under a vacuum or an inert gas atmosphere, and thus, Ag—In alloy ingot formed by melting and casting, which contains 0.1% to 1.5% by mass of In and the remainder composed of Ag and unavoidable impurities, is manufactured. Here, from the viewpoint of stabilizing the composition ratio between Ag and In, it is preferable that Ag is melted under an atmosphere substituted by argon after the atmosphere is evacuated to a vacuum level, and after melting, In is added to Ag molten metal under an argon atmosphere.

Figure 2:
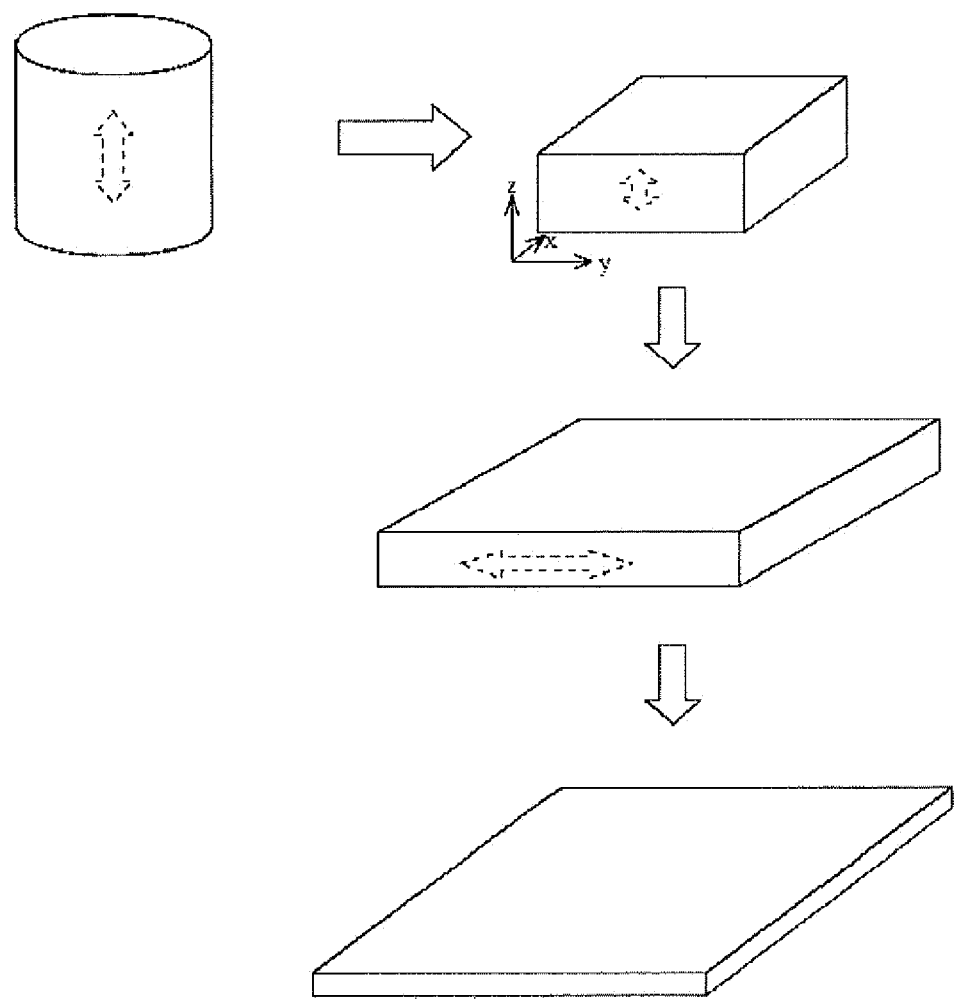
FIG. 2 is a view illustrating a hot forging method.

Next, the ingot formed by melting and casting is subjected to hot forging in order to set the average grain diameter of the crystal grain of the silver-indium alloy to a predetermined value. During hot forging, it is preferable that the ingot formed by melting and casting is heated to 750° C. to 850° C. for 1-3 hours and then is repeatedly subjected to upset forging under the forging ratio of 1/1.2 to 1/2 6-20 times. More preferably, hot forging is free-forging. For example, it is particularly preferable that hot forging is repeated while the forging direction is rotated by 90 degrees. More specifically, as shown in FIG. 2, when the cylindrical ingot is used, the ingot is first forged into a square shape. Then, the squared ingot is repeatedly subjected to forging by rotating the forging direction by 90 degrees different from the previous forging direction. At this time, from the viewpoint of setting the average grain diameter of the crystal grain of the silver-indium alloy of the entire ingot to a predetermined value, it is preferable that the squared ingot is subjected to forging by rotating it in all directions of the longitudinal direction, the lateral direction, and the height direction thereof (x, y, and z directions shown in FIG. 2). Here, all the arrows of the broken lines shown in FIG. 2 indicate the forging direction, the z direction is the casting direction, the x direction is any direction altered by 90 degrees relative to the z direction, and the y direction is the direction altered by 90 degrees relative to both the z direction and the x direction. The process is preferably repeated in order to set the average grain diameter of the crystal grain of the silver-indium alloy of the target of the present invention to the desired value and fall the dispersion of the grain diameter within the desired range. When the repeated number of times is less than six, the effect may become insufficient. On the other hand, even when the repeated number of times is greater than twenty, no further improvement in the effect of suppressing the dispersion of the grain diameter of the crystal grain of the silver-indium alloy may be expected. It is not preferable that the temperature during hot upset forging is less than 750° C. because the effect of suppressing the dispersion of the grain diameter is not sufficiently developed due to the presence of fine crystal, and also not preferable that the temperature during hot upset forging exceeds 850° C. because the effect of suppressing the dispersion of the grain diameter is not sufficiently developed due to the remaining of coarse crystal. In order to alleviate rapid cooling of ridge sections and/or edge sections formed by hot forging, it is preferable that the ridge sections and/or edge sections of the ingot is hammered, that is, so-called edge hammering is appropriately performed so as not to affect the forging of the ingot body.

Next, the forged ingot is subjected to cold-rolling until the desired thickness is reached, and the forged ingot is formed in a board. From the viewpoint of the effect of suppressing the dispersion of the grain diameter, it is preferable that the rolling reduction per one pass during cold-rolling is 5% to 10%. From the viewpoint of making the diameter of the crystal grain finer while setting the total rolling reduction to a predetermined value and maintaining the effect of suppressing the dispersion of the grain diameter, it is preferable that cold-rolling is repeatedly performed until the total rolling reduction ((thickness of ingot prior to cold-rolling−thickness of ingot after cold-rolling)/thickness of ingot prior to cold-rolling) becomes 60% to 75%. The number of passes is preferably 10 to 20 so as to develop the effect described above.

From the viewpoint of controlling the average grain diameter at a predetermined level by means of recrystallization, it is preferable that heat treatment after cold-rolling is performed for 1 to 2 hours at the temperature of 550° C. to 650° C.

After heat treatment, the board is subjected to machining such as milling, electric discharge machining, or the like until the desired dimension is reached, and thus, a silver alloy target for forming a reflective electrode film may be manufactured. From the viewpoint of suppressing the occurrence of splashing during sputtering, it is preferable that the arithmetic average surface roughness (Ra) of the sputtering surface of the target after machining is 0.2 to 2 μm.

EXAMPLES

Hereinafter, a description will be given on the present invention with reference to Examples. However, the present invention is not limited thereto.

Example 1

[Manufacture of a Silver Alloy Target]

As raw materials, Ag with the purity of 99.99% by mass or greater and In with the purity of 99.9% by mass or greater were prepared. Ag and In were placed in a high frequency vacuum furnace at the mass ratio shown in Table 1. The total mass upon melting was about 300 kg.

The vacuum chamber was evacuated to vacuum and the atmosphere was substituted by Ar gas. Then, Ag was melted under an Ar-substituted atmosphere and In was added. The resulting alloy molten metal was casted into a graphite casting mold. Then, the shrinkage cavity formed in the upper part of the ingot manufactured by casting was removed. The weight of the sound part of the ingot (y 290×370 mm) obtained was about 260 kg.

The obtained ingot was heated at the temperature of 750° C. to 850° C. for 1 hour, and then was forged by repeating the rotation of the forging direction by 90 degrees in all directions (the z direction: the casting direction, the x direction: any direction altered by 90 degrees relative to the z direction, and the y direction: the direction altered by 90 degrees relative to both the z direction and the x direction). At the forging ratio per one time of 1/1.2 to 1/2, upset forging were repeated fifteen times while changing the forging direction. The ingot was flattened at sixteenth forging and was formed to obtain the size of about 600×910×45 (mm).

After forging, the ingot was subjected to cold-rolling, and the ingot was formed in a board with the size of about 1200× 1300×16 (mm). The rolling reduction per one pass during cold-rolling was 5% to 10%, and the total number of passes was 15. The total rolling reduction during cold-rolling was 64%.

After rolling, the board was heated at the temperature of 580° C. for 1 hour, and was subjected to recrystallization processing.

Next, the board was subjected to machining until the size of 1000×1200×12 (mm) was reached, whereby the large-sized target of the present invention was obtained.

[Evaluation of a Silver Alloy Target]

(1) Warpage after Machining

The warpage of the silver alloy target in Example 1 was measured after machining, and the result was shown in Table 2.

Figure 3:
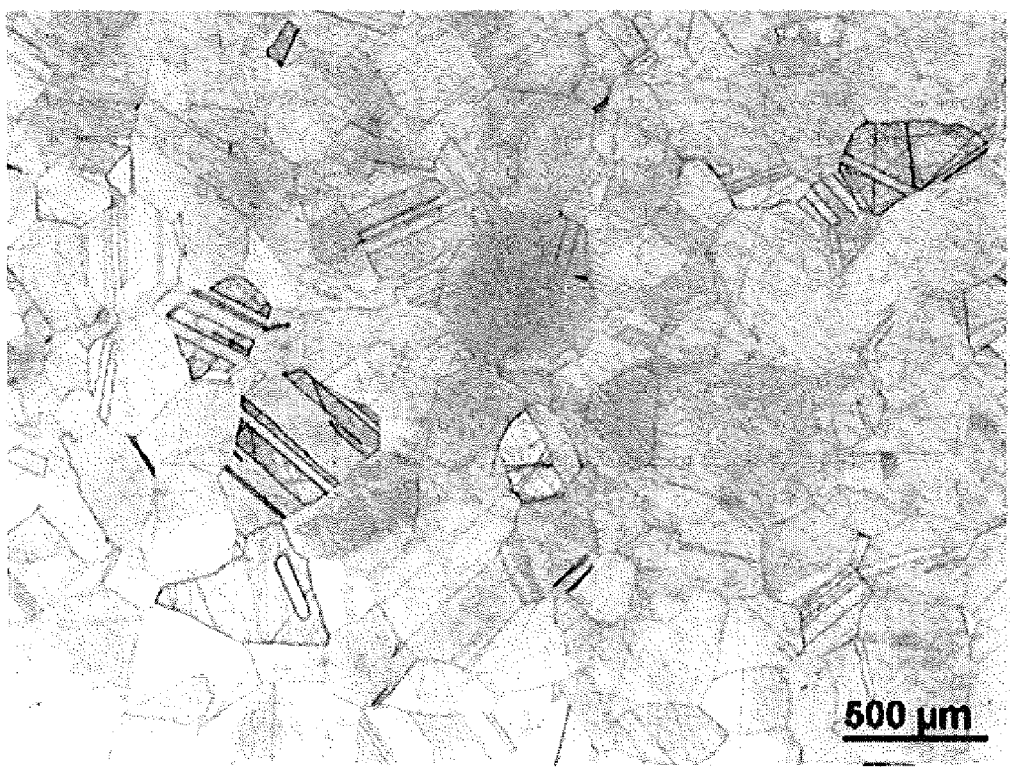
FIG. 3 is a photograph of the silver alloy target of Example 1 taken by an optical microscope at a magnification of 30×.

(2) Measurement of the Grain Diameter of the Crystal Grain of the Silver-Indium Alloy of the Target of the Present Invention As described in DESCRIPTION OF THE EMBODIMENTS, samples were uniformly obtained from sixteen points of the target of the present invention manufactured as described above with the size of 1000×1200×12 (mm). Then, the average grain diameter of the surface viewed from the sputtering surface of each sample was measured, and thus, the average grain diameter of the crystal grain of the silver-indium alloy of the target of the present invention, which is the average value of the average grain diameters of the samples, and the dispersion of the average grain diameter of the crystal grain of the silver-indium alloy were calculated. The photograph of the silver alloy target of Example 1 taken by an optical microscope at a magnification of 30× was shown in FIG. 3 and the result was shown in Table 1. In the target material of the present invention, the average grain diameter of the crystal grain of the silver-indium alloy was in the range of 150 to 400 μm, and the dispersion of the grain diameter of the crystal grain of the silver-indium alloy was 20% of the average grain diameter of the crystal grain of the silver-indium alloy or less.

(3) Measurement of the Number of Times Abnormal Discharge Occurred During Sputtering A disk having the diameter of 152.4 mm and the thickness of 6 mm was cut out from the arbitrary portion of the target of the present invention with the size of 1000×1200×12 (mm) manufactured as described above, and was soldered to a copper backing plate. The soldered target was used as the target for evaluation of splashing during sputtering, and the number of times abnormal discharge occurred during sputtering was measured. The result is shown in Table 2.

The soldered target was attached to a normal magnetron sputtering apparatus, and the atmosphere was evacuated to a pressure of $1\times10^{-4}$ Pa. Then, the soldered target was subjected to sputtering under the condition that Ar gas pressure was 0.5 Pa, the electric power applied was DC 1000 W, and the target-to-substrate distance was 60 mm. The number of times abnormal discharge occurred during sputtering was measured as the number of times abnormal discharge occurred for 30 minutes elapsed from the start of discharging by means of the arc counting function of the DC power source (model number: RPDG-50A) manufactured by MKS Instruments, Inc. The result is shown in Table 2. In the target of the present invention, the number of times abnormal discharge occurred was ten or less.

(4) Evaluation of Basic Properties as an Organic EL Film (4-1) The Surface Roughness of a Film Using the soldered silver alloy target shown in (3), sputtering was performed under the same condition as that shown in (2), and a film having the thickness of 100 nm is formed on a glass substrate having the size of 20×20 (mm) to thereby obtain a silver alloy film. The average surface roughness (Ra) of the silver alloy film was measured by an atomic force microscope. The result is shown in Table 2. The average surface roughness Ra of the film of the target of the present invention was 1 nm or less.

(4-2) Reflectivity

The reflectivity of the silver alloy film formed in the same manner as (4-1) was measured by a spectrophotometer. The absolute reflectivity of the silver alloy film of the target of the present invention at the wavelength of 550 nm was 90% or greater. The result is shown in Table 2.

Examples 2 to 4 and Comparative Examples 1 to 8

Except for the component compositions and the manufacturing conditions described in Table 1, the silver alloy targets in Examples 2 to 4 and Comparative Examples 1 to 8 were manufactured in the same manner as that in Example 1 Then, various evaluations were conducted as in Example 1. These results are shown in Tables 1 and 2.

Conventional Examples 1 and 2

As described in Example 1, Ag was melted and In was added according to the component composition described in Table 1. The resulting alloy molten metal was casted into a graphite casting mold to thereby manufacture an ingot with the size of about 400×400×150 (mm). Furthermore, the ingot was subjected to hot rolling after being heated at the temperature of 600° C. for 1 hour to thereby manufacture the silver alloy target in Conventional Example 1. As in Conventional Example 1, the casted ingot was subjected to hot rolling and then subjected to heat treatment at the temperature of 600° C. for 2 hours to thereby manufacture the silver alloy target in Conventional Example 2. As in the evaluation in Example 1, various evaluations for the silver alloy targets in Conventional Examples 1 and 2 were conducted. These results are shown in Tables 1 and 2.

Reference Example 1

Ag with the blending ratio of In described in Table 1 (the total weight used was 7 kg) was melted. The resulting alloy molten metal was casted into a graphite casting mold to thereby manufacture an ingot with the size of $\phi$ 80×110 (mm). The obtained ingot was subjected to upset forging as the same number of times, the same rolling reduction during cold-rolling and the same heat treatment as those in Comparative Example 3 to thereby obtain a board with the size of 220×220×11 (mm). As in Examples and Comparative Examples, various evaluations were conducted. These results are shown in Table 1 and Table 2. Since the target in Reference Example 1 has the size smaller than that of the targets manufactured in Examples and Comparative Examples, no evaluation was conducted for the warpage of the target in Reference Example 1 after machining.

TABLE 1

| | % BY MASS OF IN | FORGING TEMPERATURE (° C.) | THE NUMBER OF TIMES UPSET FORGING PERFORMED | TOTAL ROLLING REDUCTION DURING COLD-ROLLING (%), Note that hot-rolling was used in conventional examples | HEAT TREATMENT CONDITION AFTER COLD-ROLLING, Note that hot-rolling was used in conventional examples | AVERAGE PARTICLE DIAMETER (μm) | DISPERSION OF PARTICLE DIAMETER (%) |
|---|---|---|---|---|---|---|---|
| EXAMPLE 1 | 0.5 | 800 | 15 | 64 | 580° C., 1 HOUR(S) | 270 | 13 |
| EXAMPLE 2 | 0.1 | 750 | 13 | 65 | 560° C., 1 HOUR(S) | 160 | 18 |
| EXAMPLE 3 | 1.0 | 800 | 6 | 74 | 600° C., 1 HOUR(S) | 360 | 17 |
| EXAMPLE 4 | 1.5 | 850 | 20 | 60 | 600° C., 1 HOUR(S) | 310 | 12 |
| COMPARATIVE EXAMPLE 1 | 0.07* | 700** | 10 | 73 | 560° C., 1 HOUR(S) | 190 | 21* |
| COMPARATIVE EXAMPLE 2 | 1.7* | 800 | 15 | 65 | 600° C., 1 HOUR(S) | 300 | 13 |
| COMPARATIVE EXAMPLE 3 | 0.4 | 800 | 5* | 61 | 580° C., 1 HOUR(S) | 280 | 25* |
| COMPARATIVE EXAMPLE 4 | 0.6 | 800 | 8 | 40 | 600° C., 1 HOUR(S) | 350 | 23* |
| COMPARATIVE EXAMPLE 5 | 0.6 | 800 | 15 | 80 | 600° C., 1 HOUR(S) | 360 | 26* |
| COMPARATIVE EXAMPLE 6 | 0.7 | 800 | 10 | 65 | 500° C., 0.5 HOUR(S) | 92* | 80* |
| COMPARATIVE EXAMPLE 7 | 0.7 | 800 | 10 | 63 | 700° C., 2 HOUR(S) | 460* | 11 |
| COMPARATIVE EXAMPLE 8 | 0.5 | 900** | 15 | 64 | 580° C., 1 HOUR(S) | 440* | 28* |
| CONVENTIONAL EXAMPLE 1 | 0.6 | | | 89 | | 310 | 120* |
| CONVENTIONAL EXAMPLE 2 | 0.6 | | | 89 | 600° C., 2 HOUR(S) | 550* | 35* |
| REFERENCE EXAMPLE 1 | 0.4 | 800 | 5 | 61 | 580° C., 1 HOUR(S) | 180 | 17 |

MARK * REPRESENTS A VALUE DEPARTING FROM THE CONDITION OF THE PRESENT INVENTION

MARK ** FALLS WITHIN THE CONDITION OF THE PRESENT INVENTION BUT IS NOT A PREFERABLE RANGE

TABLE 2

| | THE NUMBER OF TIMES ABNORMAL DISCHARGE OCCURRED (times) | WARPAGE AFTER MACHINING (mm) | SURFACE ROUGHNESS OF FILM (Ra: nm) | ABSOLUTE REFLECTIVITY AT WAVELENGTH OF 550 nm (%) |
|---|---|---|---|---|
| EXAMPLE 1 | 2 | 0.5 | 0.8 | 96.8 |
| EXAMPLE 2 | 5 | 1.1 | 0.9 | 97.3 |
| EXAMPLE 3 | 4 | 0.4 | 0.8 | 96.1 |
| EXAMPLE 4 | 3 | 0.4 | 0.7 | 95.7 |
| COMPARATIVE EXAMPLE 1 | 4 | 1.8 | 1.3 | 97.8 |
| COMPARATIVE EXAMPLE 2 | 2 | 0.4 | 0.7 | 89.1 |
| COMPARATIVE EXAMPLE 3 | 20 | 0.6 | 0.8 | 96.5 |
| COMPARATIVE EXAMPLE 4 | 18 | 0.6 | 0.8 | 96.3 |
| COMPARATIVE EXAMPLE 5 | 23 | 0.6 | 0.8 | 96.3 |
| COMPARATIVE EXAMPLE 6 | 28 | 0.7 | 0.7 | 96.5 |
| COMPARATIVE EXAMPLE 7 | 13 | 0.5 | 0.7 | 96.3 |
| COMPARATIVE EXAMPLE 8 | 13 | 0.4 | 0.8 | 98.7 |
| CONVENTIONAL EXAMPLE 1 | 213 | 1.2 | 0.8 | 96.6 |
| CONVENTIONAL EXAMPLE 2 | 88 | 0.8 | 0.8 | 96.5 |
| REFERENCE EXAMPLE 1 | 4 | | 0.8 | 96.4 |

As can be seen from Table 1, in Examples 1 to 4, the average grain diameter of the crystal grain of the silver-indium alloy was 160 to 360 µm, and the dispersion of the grain diameter was 12 to 18%. These were preferable ranges. In contrast, in Comparative Example 3 in which the number of times upset forging repeated was five, the dispersion of the grain diameter was as high as 25%. In Comparative Example 4 in which the total rolling reduction during cold-rolling was 40%, the dispersion of the grain diameter was as high as 23%. In Comparative Example 5 in which the total rolling reduction during cold-rolling was 80%, the dispersion of the grain diameter was as high as 26%. In Comparative Example 6 in which the temperature of heat treatment after cold-rolling was 500° C., and Comparative Example 7 in which the temperature was 700° C., the average grain diameters were 92 µm and 460 µm, respectively, and both have fallen outside a desired range. Furthermore, in Comparative Example 8 in which the temperature of hot forging was 900° C., the average grain diameter was 440 µm and has fallen outside a desired range. In Conventional Example 1, the dispersion of the grain diameter was as high as 120%. In Conventional Example 2, the average grain diameter was as large as 550 µm and the dispersion of the grain diameter was as high as 35%. In Reference Example 1, evaluation was conducted for the small-sized target as compared with a large-sized target for which the present invention becomes effective. Despite the fact that the small-sized target was manufactured under the same condition as that in Comparative Example 3, the dispersion of the grain diameter was 17% and advantageous.

As can be seen from Table 2, in Examples 1 to 4, good results were obtained for the number of times abnormal discharge occurred, the warpage after machining, the surface roughness of the film, and the absolute reflectivity at the wavelength of 550 nm. In contrast, in Comparative Example 1 in which In was 0.07% by mass, the warpage after machining was as large as 1.8 mm and the surface roughness of the film was also as large as 1.3 µm. In Comparative Example 2 in which In was 1.7% by mass, the absolute reflectivity at the wavelength of 550 nm was as small as 89.1%. In Comparative Examples 3, 4, 6, 7 and 8 and Conventional Examples 1 and 2, the number of times abnormal discharge occurred were thirteen or more.

As described above, the silver alloy target for forming a reflective electrode film of the present invention suppresses the occurrence of abnormal discharge. The target is subjected to sputtering to thereby obtain a reflective electrode film for an organic EL, which exhibits excellent properties such as high reflectivity and the small surface roughness of the reflective film.

The technical scope of the present invention is not limited to the aforementioned embodiments and Examples, but the present invention may be modified in various ways without departing from the scope or teaching of the present invention.

What is claimed is:

1. A silver alloy target for forming a reflective electrode film for an organic EL element, the silver alloy target having a component composition containing 0.1% to 1.5% by mass of In and a reminder composed of Ag, wherein an average grain diameter of a crystal grain of the alloy is 150 to 400 µm, and a dispersion of the grain diameter of the crystal grain is 20% or less of the average grain diameter of the crystal grain.

2. The silver alloy target for forming a reflective electrode film for an organic EL element according to claim 1, wherein a surface of the target has an area equal to or greater than 0.25 m².

3. A method for manufacturing a silver alloy target for forming a reflective electrode film for an organic EL element according to claim 1, the method comprising in sequence:
repeating hot upset forging 6 to 20 times for an ingot formed by melting and casting having a component composition containing 0.1% to 1.5% by mass of In and a reminder composed of Ag,
cold-rolling the forged ingot to form a band,
subjecting the cold-rolled board to a heat treatment; and
machining the heat-treated board.

4. The method according to claim 3, wherein a temperature of the hot upset forging is from 750° C. to 850° C.

* * * * *